United States Patent [19]
Ohnakado

[11] Patent Number: 5,901,084
[45] Date of Patent: May 4, 1999

[54] NONVOLATILE SEMICONDUCTOR MEMORY DEVICE HAVING FLOATING GATE ELECTRODE

[75] Inventor: Takahiro Ohnakado, Hyogo, Japan

[73] Assignee: Mitsubishi Denki Kabushiki Kaisha, Tokyo, Japan

[21] Appl. No.: 08/933,764

[22] Filed: Sep. 23, 1997

[30] Foreign Application Priority Data

Mar. 10, 1997 [JP] Japan .................................. 9-054906

[51] Int. Cl.$^6$ .......................... G11C 16/04; H01L 29/788
[52] U.S. Cl. .................... 365/185.18; 365/185.24; 257/321; 257/322
[58] Field of Search ................. 365/185.18, 185.01, 365/185.24; 257/316, 320, 321, 322

[56] References Cited

U.S. PATENT DOCUMENTS

| | | | |
|---|---|---|---|
| 3,744,036 | 7/1973 | Frohman-Bentchkowsky | 365/185.25 |
| 5,260,593 | 11/1993 | Lee | 365/185.24 |
| 5,650,649 | 7/1997 | Tsukiji | 257/316 |

FOREIGN PATENT DOCUMENTS

| | | |
|---|---|---|
| 4-25176 | 1/1992 | Japan . |
| 6-125089 | 5/1994 | Japan . |
| 7-169861 | 7/1995 | Japan . |
| 7-302848 | 11/1995 | Japan . |
| 8-153808 | 6/1996 | Japan . |

OTHER PUBLICATIONS

"Stress Induced Leakage Current Limiting to Scale Down EEPROM Tunnel Oxide Thickness" by Naruke et al, IEDM Tech. Dig. 1988, pp. 424–427.

"Stress–Induced Current in Thin Silicon Dioxide Films" by Moazzami et al, IEDM Tech. Dig. 1992, pp. 139–142.

"Hole Infection SiO$_2$ Breakdown Model for Very low Voltage Lifetime Extrapolation" by Schuegraf et al, IEEE Transactions on Electron Devices, vol. 41, No. 5, May 1994, pp. 761–767.

"A Quantitative Analysis of Stress Induced Excess Current (SIEC) in SiO$_2$ Films" by Sakakibara et al, IEEE Intl. Reliability Physics Proceedings, Apr. 30, May 1,2, 1996, pp. 100–107.

*Primary Examiner*—Son Mai
*Attorney, Agent, or Firm*—Sughrue, Mion, Zinn Macpeak & Seas, PLLC

[57] ABSTRACT

A nonvolatile semiconductor memory device is obtained of which tunnel oxide film can be made thinner and which can allow low voltage and power consumption. P type polycrystal silicon is used as a floating gate electrode. Thickness of a tunnel oxide film (first insulating film) is set to less than 10 nm. By using P type polysilicon as a material of the floating gate electrode, a barrier height of a well-type potential is increased from 3.1 eV to 4.4 eV, and thus the leak current is effectively prevented. Thus, the film thickness of the tunnel oxide film can be made less than 10 nm, and operating voltage can also be lowered. Therefore, reduction in power consumption and improvement in performance of the nonvolatile semiconductor memory device can be achieved.

4 Claims, 17 Drawing Sheets

NONVOLATILE SEMICONDUCTOR MEMORY DEVICE HAVING FLOATING GATE ELECTRODE

BACKGROUND OF THE INVENTION

1. Field of the Invention

The present invention relates to a nonvolatile semiconductor memory device and more particularly to a nonvolatile semiconductor memory device having a floating gate electrode.

2. Description of the Background Art

Recently, a flash memory, a kind of nonvolatile semiconductor memory devices, has come to be well known. The flash memory is expected to be a memory device of the next generation because it can be manufactured at lower cost than a dynamic random access memory (DRAM).

FIG. 17 is a sectional view showing a memory cell of such a conventional flash memory. Referring to FIG. 17, in the conventional flash memory, an N type drain diffusion layer 102 and an N type source diffusion layer 103 are formed spaced apart by a prescribed distance, with a channel region sandwiched therebetween, at the main surface of a P well 101 formed at the surface of a silicon substrate (Si substrate) (not shown). On the channel region, a floating gate electrode 105 of an N type polycrystalline silicon film (hereinafter referred to as a "polysilicon film") is formed with a tunnel oxide film 104 therebetween. On floating gate electrode 105, an interlayer insulating film 106 of an ONO film is formed. On interlayer insulating film 106, a control gate electrode 107 is formed of N type polysilicon. A side wall oxide film 108 is formed on both sides of floating gate electrode 105 and control gate electrode 107.

Source 103 is connected to a corresponding source line (not shown), and drain diffusion layer 102 is connected to a corresponding bit line (not shown). Floating gate electrode 105 is for accumulating charges representing information, and control gate electrode 107 is connected to a corresponding word line (not shown).

In operation, erasing or writing is carried out by injecting electrons into floating gate electrode 105 or by extracting electrons accumulated in floating gate electrode 105, with the FN tunnel phenomenon of tunnel oxide film 104 or the channel hot electron phenomenon. Thus, thresholding/binarization is realized by the state of electrons in floating gate electrode 105, and "0" or "1" is read out according to the state.

In the flash memory or EEPROM, amount of electrons accumulated in floating gate electrode 105 is thresholded, thus the state of the transistor is represented by binary values. Therefore, the memory function is implemented. By surrounding floating gate electrode 105 with insulating films (tunnel oxide film 104 and interlayer insulating film 106), electrons accumulated in floating gate electrode 105 can be kept for as long a period as more than ten years, and thus the nonvolatile memory is implemented. Specifically, by surrounding floating gate electrode 105 with high band barriers formed between insulating films (104, 106) having wide band gaps and floating gate electrode 105, electrons in floating gate electrode 105 are prevented from escaping outside. In short, electrons are confined in a well-type potential.

Normally, an $SiO_2$ film and an ONO film are used as insulating films (104, 106) surrounding floating gate electrode 105. The ONO film is used as interlayer insulating film 106 between control gate electrode 107 and floating gate electrode 105.

As floating gate electrode 105, N type polysilicon is generally used which can accumulate electrons and achieve resistance that is low enough as a electrode. Polysilicon is a most generally used electrode material in the current ULSI process because of many reasons. One of them is that polysilicon provides good junction interface with the $SiO_2$ film. Since the N type polysilicon which includes a large amount of N type impurity is N type, it has a lot of free electrons in a film and, as a result, it has a metal property of low resistance. In a floating type nonvolatile semiconductor memory, data is stored by injecting and extracting electrons into and out of floating gate electrode 105 to control the amount of electrons accumulated in floating gate electrode 105. As floating gate electrode 105, is typically formed of N type polysilcon which is a low resistance electrode having a large amount of free electrons. Since an N type polysilicon film is used as floating gate electrode 105 in a conventional flash memory, conduction band electrons in floating gate electrode 105 are extracted toward silicon substrate 101 through tunnel oxide film 104 by using FN tunnel current, as shown in FIG. 18.

If the floating gate type nonvolatile semiconductor memory is miniaturized in a similar manner as miniaturization of other ULSI devices, operating voltage would be lowered while insulating films such as tunnel oxide film 104 and interlayer insulating film 106 are made thinner. In ULSI device development, this is a general understanding known as a scaling rule of an MOS type transistor.

However, tunnel oxide film 104 and interlayer insulating film 106 which are extremely thin may cause part of electrons accumulated in floating gate electrode 105 to pass through tunnel oxide film 104 or interlayer insulating film 106 and to leak into the silicon substrate or control gate electrode 107, due to the FN tunnel phenomenon, the direct tunnel phenomenon or the tunnel phenomenon through a trap in an insulating film. FIG. 19 shows a band for illustrating a mechanism of leak current at the time of data retention (with no voltage applied) of a conventional write (or erase) state. If tunnel oxide film 104 is thin, conduction band electrons in floating gate electrode 105 are conventionally leaked due to the FN tunnel phenomenon as shown in FIG. 19, thus degrading the data retention characteristics. For simplicity, interlayer insulating film 106 is not an ONO film but an $SiO_2$ film in FIG. 19.

When thin tunnel oxide film 104 is used in a floating gate type nonvolatile semiconductor memory such as the EEPROM, stress on tunnel oxide film 104 due to repetition of writing and erasing operations causes leak current if an electric field applied to tunnel oxide film 104 is low. This is disclosed, for example, in K. Naruke et. al., IEDM Tech. Dig., p424, 1988 (reference 1).

The low electric field leak current caused by such stress is called stress induced leak current. When this type of stress induced current is caused in the floating gate type nonvolatile semiconductor memory, electrons accumulated in floating gate electrode 105 are gradually lost, while memory data is retained, due to a small electric field applied to tunnel oxide film 104. Therefore, it is believed that such a thin tunnel oxide film 104 as would cause this type of stress induced leak current can not be applied for the floating gate type nonvolatile semiconductor memory. In short, the characteristics of the stress induced leak current limits thinness of tunnel oxide film 104 of the floating gate type nonvolatile semiconductor memory.

Naruke et. al. and R. Moazzami et. al., IEDM Tech. Dig., p139, 1992 (reference 2) report that the stress induced current is caused significantly when tunnel oxide film 104 is thinner than 10 nm.

When tunnel oxide film 104 can not be made thinner in the floating gate type nonvolatile semiconductor memory, the operating voltage can not be lowered. It is therefore difficult to reduce power consumption. For a floating gate type nonvolatile semiconductor memory represented by a flash memory which dominates the market for portable machines, lower power consumption is essential. Since reduction in the operating voltage is strongly required, implementation of a substantially thinner insulating film (tunnel oxide film 104) as thin as that of other ULSI devices is necessary.

As described above, the stress induced current becomes undesirably large if a film thickness of tunnel oxide film 104 is less than 10 nm. Therefore, it is conventionally impossible to make tunnel oxide film 104 thinner. As a result, the operating voltage cannot be lowered, making it difficult to lower power consumption.

SUMMARY OF THE INVENTION

An object of the present invention is to provide a floating gate type nonvolatile semiconductor memory device which can reduce the stress induced leak current even if a tunnel oxide film is made thinner.

Another object of the present invention is to implement lower voltage and power consumption in the nonvolatile semiconductor memory device by realizing a thinner tunnel oxide film.

A nonvolatile semiconductor memory device in accordance with a first aspect of the present invention includes N type source and drain regions, a first insulating film, a floating gate electrode, a second insulating film, and a control gate electrode. At the main surface of a semiconductor region, the source and drain regions are formed spaced apart with a channel region therebetween. On the channel region, the first insulating film is formed to have a thickness of less than 10 nm. The floating gate electrode is formed on the first insulating film, and it includes P type polycrystalline silicon (polysilicon). The second insulating film is formed on the floating gate electrode, and the control gate electrode is formed on the second insulating film. An electric field of at least 10 MV/cm is applied to the first insulating film, and electrons in the floating gate electrode are extracted toward the main surface of the semiconductor region by the tunnel phenomenon. Thus, the amount of positive charges in the floating gate electrode is increased to perform a writing or erasing operation. In the nonvolatile semiconductor memory device in accordance with the first aspect, as the floating gate is adapted to contain P type polycrystalline silicon, a barrier height of a potential can be increased from 3.1 eV to 4.4 eV as compared with the case where N type polycrystalline silicon is used as the floating gate electrode. As a result, the leak current can be reduced. Since the leak current can thus be reduced, it becomes possible to make thickness of the tunnel oxide film (the first insulating film) less than 10 nm in the present invention. Since the thickness of the first insulating film can be made less than 10 nm, the operating voltage at the time of writing/erasing can be lowered. As a result, reduction in power consumption and improvement in the characteristics of the nonvolatile semiconductor memory device can be achieved.

A nonvolatile semiconductor memory device in accordance with another aspect of the present invention includes N type source and drain regions, a first insulating film, a floating gate electrode, a second insulating film, and a control gate electrode. At the main surface of a P type semiconductor region, the source and drain regions are formed spaced apart with a channel region therebetween. The first insulating film is formed on the channel region, and it has a thickness of less than 10 nm. The floating gate electrode is formed on the first insulating film, and it includes P type polycrystal silicon. The second insulating film is formed on the floating gate electrode, and the control gate electrode is formed on the second insulating film. A writing or erasing operation is performed by using the hot hole injection from the main surface of the semiconductor region to the floating gate electrode so that the amount of positive charges in the floating gate electrode is increased. In the nonvolatile semiconductor memory device in accordance with this embodiment of the present invention as well, as the floating gate electrode is adapted to contain P type polycrystal silicon, a barrier height of a potential can be increased from 3.1 eV to 4.4 eV as compared with the case where the floating gate electrode is formed of N type polycrystalline silicon. Thus, the leak current can substantially be reduced. Since the leak current can thus be reduced, it becomes possible to make the thickness of the first insulating film, which is a tunnel oxide film, less than 10 nm. Thus, it also becomes possible to lower the operating voltage. By adapting the floating gate electrode to contain P type polycrystalline silicon, the stress induced current can theoretically be reduced, and thus the data retention characteristics of the nonvolatile semiconductor memory device can substantially be improved. Therefore, hot hole injection can be used for the writing or erasing operation.

A nonvolatile semiconductor memory device in accordance with yet another aspect of the present invention includes P type source and drain regions, a first insulating film, a floating gate electrode, a second insulating film, and a control gate electrode. At the main surface of an N type semiconductor region, P type source/drain regions are formed spaced apart with a channel region therebetween. The first insulating film is formed on the channel region, and it has a thickness of less than 10 nm. The floating gate electrode is formed on the first insulating film, and it includes P type polycrystalline silicon. The second insulating film is formed on the floating gate electrode, and the control gate electrode is formed on the second insulating film. An electric field of at least than 10 MV/cm is applied to the first insulating film, and electrons in the floating gate electrode are extracted toward the main surface of the semiconductor region by the tunnel phenomenon. Thus, a writing or erasing operation is performed by increasing the amount of positive charges in the floating gate electrode. In the nonvolatile semiconductor memory device in accordance with this aspect, a barrier height of a well-type potential can be increased by adopting the floating gate electrode to contain P type polycrystalline silicon. Thus, the leak current can substantially be reduced. Since the source and drain regions which are also P type are provided, conduction band electrons do not exist in the source and drain regions. Thus, electron leak from the source and drain regions to the floating gate electrode can be reduced as compared with the NMOS type. Therefore, the data retention characteristics can be improved compared with the NMOS type even if device operation conditions are set so that an electric field applied to the tunnel oxide film at the time of data retention is in a direction in which electrons are leaked form the source and drain regions to the floating gate electrode.

A nonvolatile semiconductor memory device in accordance with a further aspect of the present invention includes P type source and drain regions, a first insulating film, a floating gate electrode, a second insulating film, and a control gate electrode. At the main surface of an N type semiconductor region, P type source and drain regions are formed spaced apart with a channel region therebetween. The first insulating film is formed on the channel region, and it has a thickness of less than 10 nm. The floating gate electrode is formed on the first insulating film, and it includes P type polycrystal silicon. The second insulating film is formed on the floating gate electrode, and the control gate electrode is formed on the second insulating film. A writing or erasing operation is performed by increasing the amount of positive charges in the floating gate electrode with the hot hole injection phenomenon from the main surface of the semiconductor region to the floating gate electrode. In the nonvolatile semiconductor memory device in accordance with this embodiment, the floating gate electrode is adopted to contain P type polycrystal silicon, and the source and drain regions are P type. Thus, the leak current from the floating gate electrode at the time of data retention can be reduced, and electron leak from the source and drain regions to the floating gate electrode can be reduced as compared with the NMOS type. Therefore, the data retention characteristics can be improved as compared with the NMOS type even if an electric field applied to the tunnel oxide film (the first insulating film) at the time of data retention is in a direction in which electrons are leaked from the source and drain regions to the floating gate electrode. Further, by using P type polycrystalline silicon for the floating gate electrode, the stress leak current can theoretically be reduced, and thus the data retention characteristic of the nonvolatile semiconductor memory device can substantially be improved. As a result, hot hold injection can be used for the writing or erasing operation.

In one structure of the above described aspects, the control gate electrode is adopted to contain P type polycrystalline silicon. By thus using P type polycrystalline silicon for the control gate electrode, the potential barrier against electrons, of the second insulating film between the control gate electrode and the floating gate electrode, is increased. Thus, the amount of electrons leaked from the control gate electrode through the second insulating film can be reduced. As a result, degradation of the data retention characteristics due to electron leak from the control gate electrode can be prevented, and thus the second insulating film can be made thinner. It realizes lower operating voltage and electric consumption.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described below with reference to the drawings.

(First Embodiment)

Figure 1:
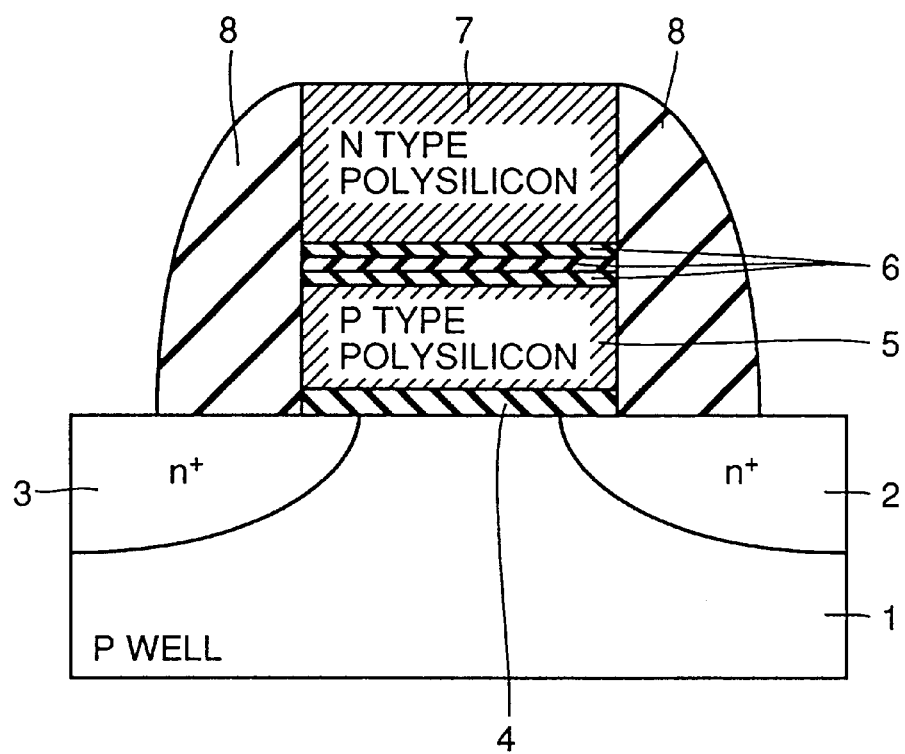
FIG. 1 is a sectional view showing a memory cell of a floating gate type nonvolatile semiconductor memory in accordance with a first embodiment of the present invention.

Referring to FIG. 1, in a memory cell of a first embodiment, an N type drain diffusion layer 2 and an N type source diffusion layer 3 are formed spaced apart by a prescribed distance with a channel region sandwiched therebetween, at the surface of a P well 1 formed at the surface of a silicon substrate (Si substrate)(not shown). On the channel region, a tunnel oxide film (first insulating film) 4 having a thickness of less than 10 nm is formed. On tunnel oxide film 4, a floating gate electrode 5 of P type polysilicon is formed. On floating gate electrode 5, a control gate electrode 7 of an N type polysilicon film is formed with an interlayer insulating film (second insulating film) 6 of an ONO film therebetween. A side wall oxide film 8 is formed on both sides of floating gate electrode 5 and control gate electrode 7.

Figure 18:
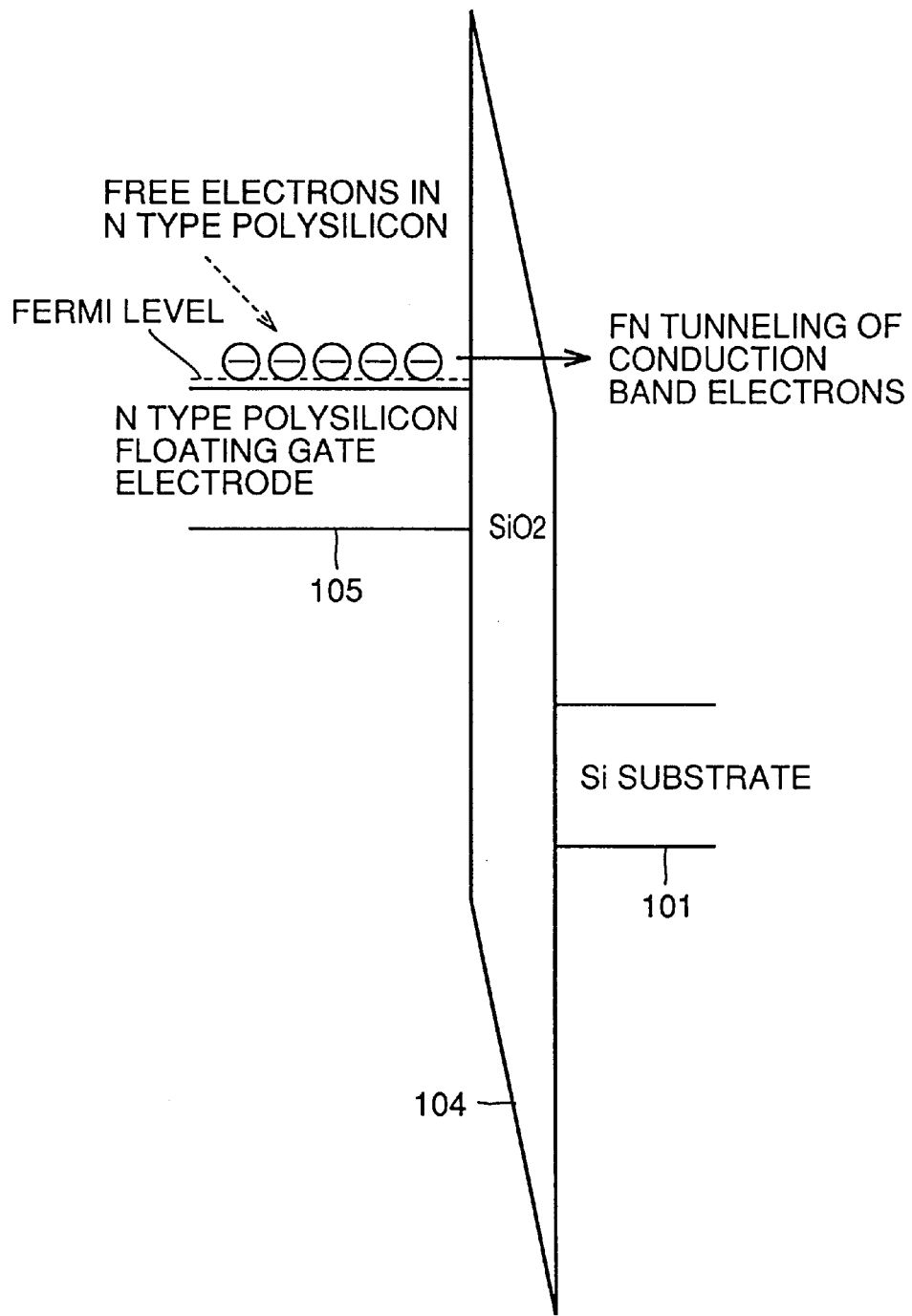
FIG. 18 shows a band for illustrating a writing or erasing operation of the nonvolatile semiconductor memory shown in FIG. 17.
Figure 19:
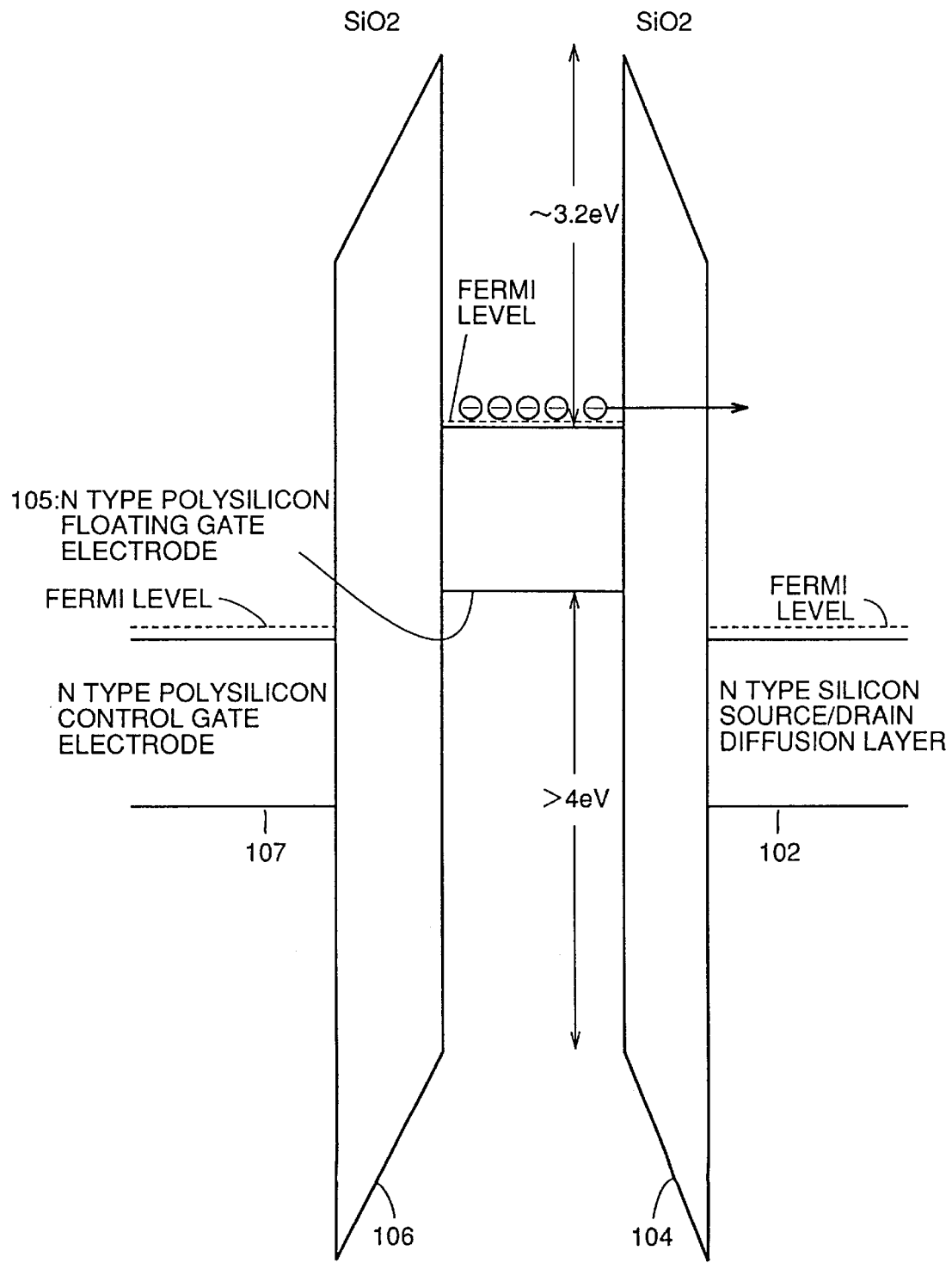
FIG. 19 shows a band for illustrating a writing or erasing operation when a conventional floating gate electrode of N type polysilicon is used.

Unlike the conventional structure shown in FIG. 18, a P type polysilicon film is used as floating gate electrode 5 in the first embodiment. By the use of the P type polysilicon film as floating gate electrode 5, a barrier height of a well-type potential becomes as large as about 4.4 eV. This barrier height (about 4.4 eV) is greater than the barrier height (3.1 eV) of the well-type potential of N type polysilicon. Here, the band gap of Si (silicon) is 1.1 eV, and the Fermi level of P type polysilicon is lower than the maximum level of an Si Valence band by 0.1 eV.

By the use of P type polysilicon as a material of floating gate electrode 5, the barrier height of the welltype potential is increased from 3.1 eV to 4.4 eV, so that the leak current can effectively be prevented. Therefore, tunnel oxide film 4 can be made thinner than 10 nm, thus the operating voltage can also be lowered. As a result, reduction in power consumption and improvement in the performance of the nonvolatile semiconductor memory device can be achieved. Effects of reducing the leak current when the barrier height of the well-type potential is increased from 3.1 eV to 4.4 eV will be described below.

Now, operation of a memory cell in accordance with the first embodiment shown in FIG. 1 will be described. When P type polysilicon is used as floating gate electrode 5, free carriers existing in the P type polysilicon are holes (positive charges). In the floating gate type nonvolatile semiconductor memory in this embodiment, therefore, data is stored by changing the amount of holes in floating gate electrode 5 so that a threshold of the memory cell is changed. Although the amount of holes are thus controlled for data storage, injection of electrons from P well 1 and extraction of electrons from floating gate electrode 5 can be performed as usual for the writing/erasing operation because of the following reasons.

Figure 2:
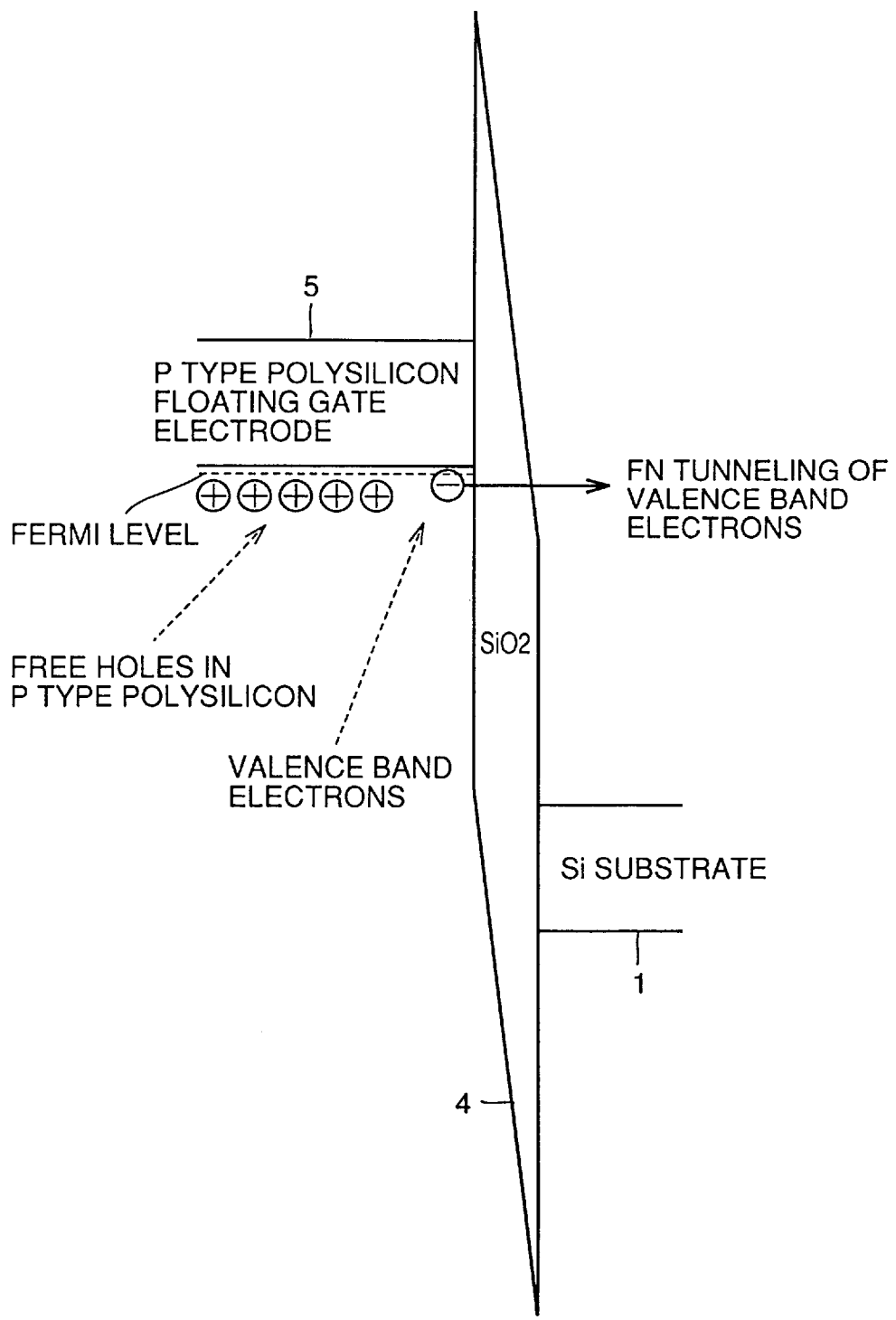
FIG. 2 shows a band illustrating operation of the nonvolatile semiconductor memory shown in FIG. 1.

When electrons are injected from P well 1, the electrons soon recombine with holes which are free carriers in floating gate electrode 5. As a result, the amount of holes accumulated in floating gate electrode 5 can be reduced. Since electrons do not exist in the conduction band of P type polysilicon when electrons are extracted from floating gate electrode 5 as shown in FIG. 2, electrons are extracted from the valence band by the tunnel phenomenon. In this case, only holes which were coupled, in the valence band, with electrons to be extracted are left behind in the floating gate electrode. As a result, the amount of positive charges accumulated in floating gate electrode 5 can be increased.

In the floating gate type nonvolatile semiconductor memory using the P type polysilicon, the leak current at the time of data retention, related to the data retention characteristics, also derives from the electrons. In short, a potential barrier against holes, of P type polysilicon, and that of insulating film (SiO$_2$) are as large as 4 eV, and effective mass of a hole is heavier than an electron. According to these reasons, components derived from electrons are to be taken into account when considering current flowing into floating gate electrode 5 and current leaking from floating gate electrode 5 at the time of data retention.

Figure 17:
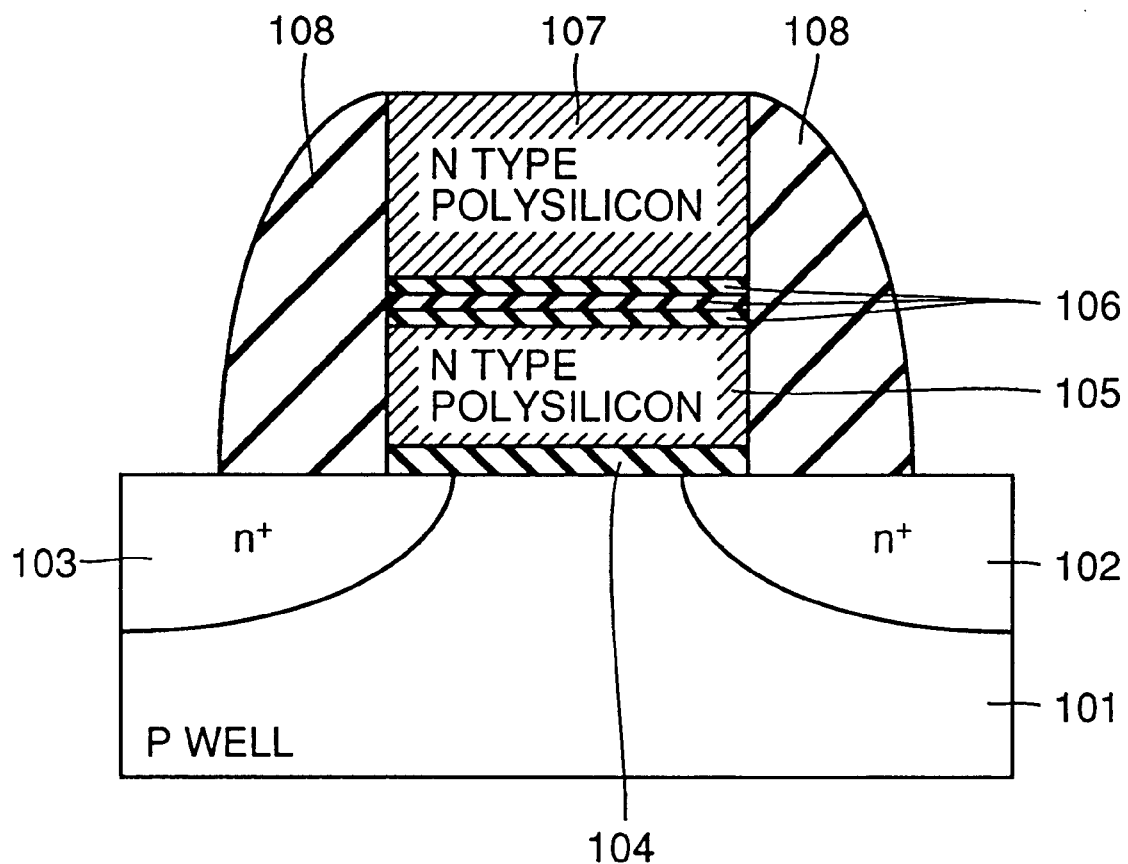
FIG. 17 is a sectional view showing a memory cell of a conventional floating gate type nonvolatile semiconductor memory.

When N type polysilicon is used as floating gate electrode 105 as in the case of the conventional memory cell shown in FIG. 17, the barrier height of the well type potential formed by N type polysilicon and an insulating film (SiO$_2$) surrounding it is about 3.1 eV. Here, a potential difference between the minimum level of an Si conduction band and the minimum level of an SiO$_2$ is 3.2 eV, and the Fermi level of N type polycrystal is higher than the minimum level of the Si conduction band by 0.1 eV. On the other hand, when P type polysilicon is used as floating gate electrode 5 as in the case of the first embodiment, the barrier height of the well-type potential is as large as about 4.4 eV. In this case, the band gap of Si is 1.1 eV, and the Fermi level of P type polysilicon is lower than the maximum level of the Si Valence band by 0.1 eV. Effects of reducing the leak current through the SiO$_2$ film, when the barrier height of the well-type potential is thus increased from 3.1 eV to 4.4 eV, will be considered briefly.

Referring to FIGS. 1 and 2, a negative potential and a positive or ground potential are respectively applied to control gate electrode 7 and the substrate, as a voltage applied during operation in the first embodiment. The same potential as the substrate is applied to or released from source diffusion layer 3 or drain diffusion layer 2. Thus, valence band electrons of floating gate electrode 5 are extracted by using FN tunnel current as shown in FIG. 2. In this case, an electric field of not less than 10 MV/cm is applied to tunnel oxide film 4. The writing or erasing operation is carried out in this manner.

Figure 3:
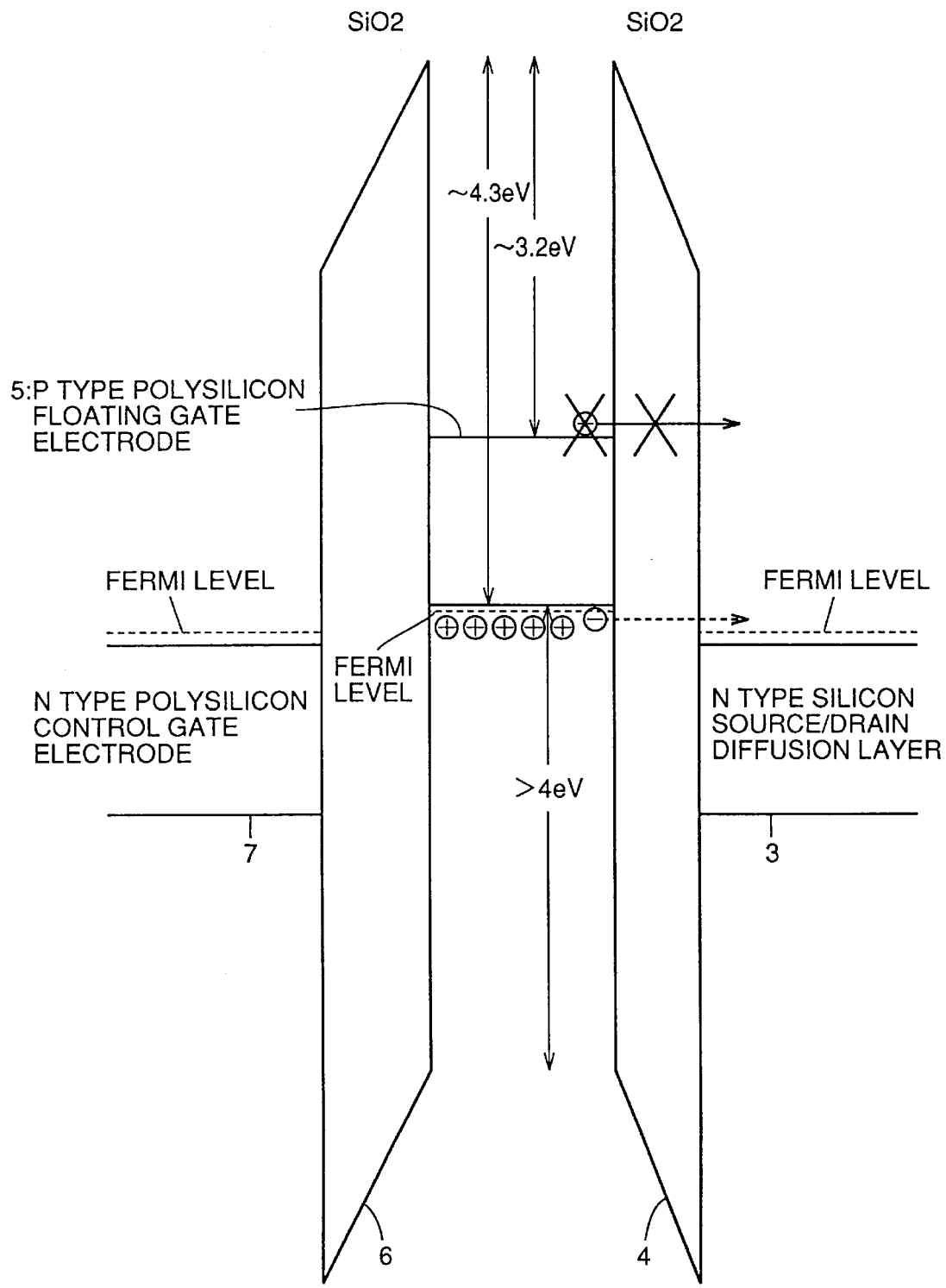
FIG. 3 shows a band when an electric field across the tunnel oxide film at the time of data retention is in a direction in which electrons flow from the floating gate electrode to the Si substrate.
Figure 4:
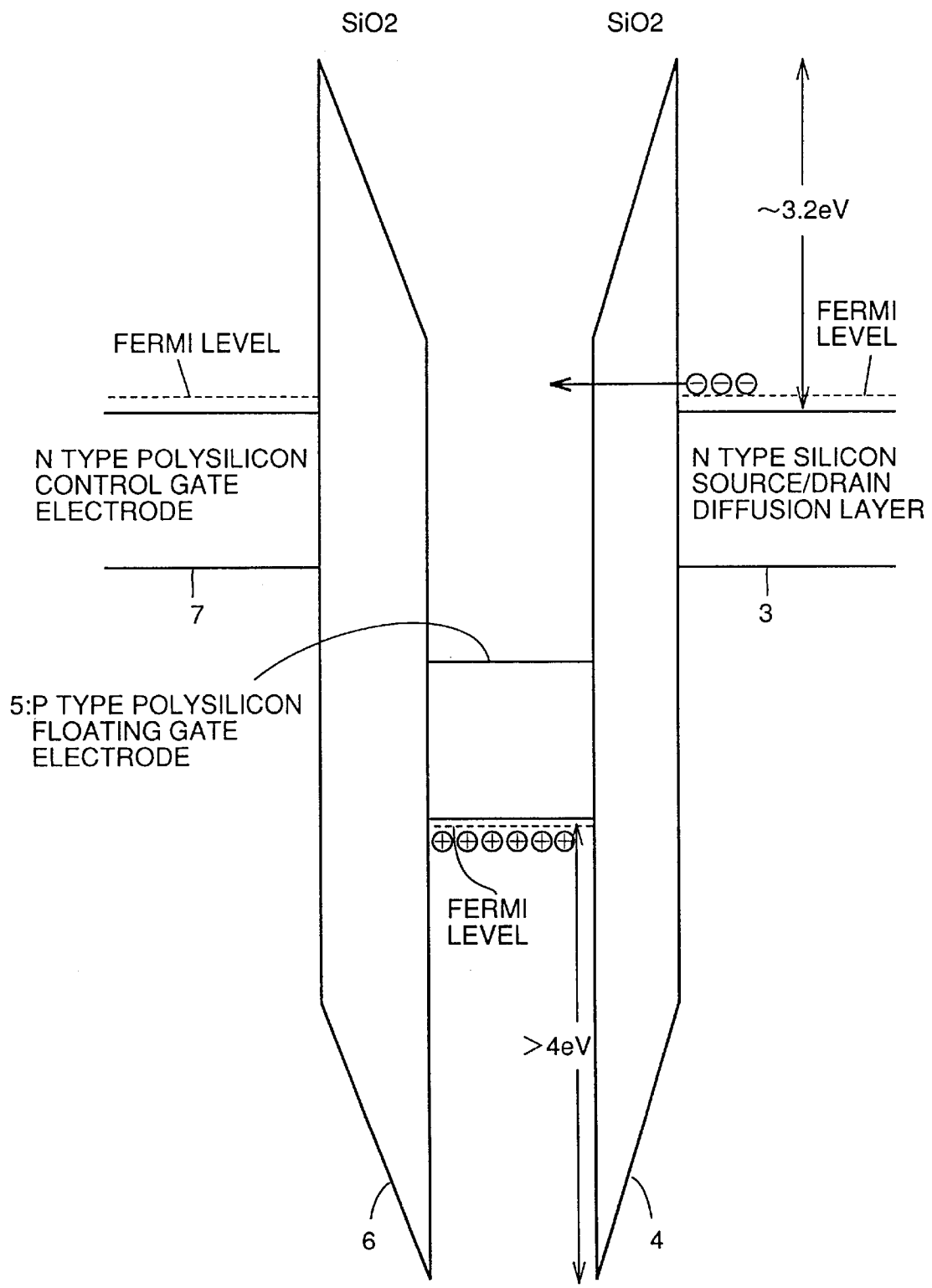
FIG. 4 shows a band when an electric field across the tunnel oxide film at the time of data retention is in a direction in which electrons flow from the Si substrate to the floating gate electrode.

FIGS. 3 and 4 show energy bands at the time of data retention (with no voltage applied) of the write or erase state in the first embodiment. For simplicity, interlayer insulating film 6 is not an ONO film but an SiO$_2$ film in FIGS. 3 and 4. Referring to FIG. 3, since conduction band electrons do not exist in floating gate electrode 5, the leak current due to the tunnel phenomenon of conduction band electrons in floating gate electrode 5 is not caused. Since the potential barrier of the oxide film against electrons in the valence band is high, the leak current due to the tunnel phenomenon of valence band electrons is very small. Referring to FIG. 4, the leak current in this case is comparable to that of the conventional structure shown in FIG. 17.

Let us consider all mechanisms derived from the tunnel phenomenon from the view point of the leak current through the SiO$_2$ film. The FN tunnel current and the direct tunneling current are among the most representative tunnel phenomena. First, the extent to which the FN tunnel current varies with changes in the barrier height of a potential is calculated. It is known that the FN tunnel current is represented by the following equation (1).

$$J_{FN} = \frac{q^2 E_{ox}^2}{8\pi h \phi_b} \exp\left(-\frac{4\sqrt{2m^*}(q\phi_b)^{\frac{3}{2}}}{3q\hbar E_{ox}}\right) \quad (1)$$

$J_{FN}$: FN tunnel current density
$\phi_b$: potential barrier height
$E_{ox}$: SiO$_2$ electric field strength
$m^*$: effective mass
$q$: amount of electron charges
$h$: Planck constant $$\hbar = \frac{h}{2\pi}$$

It is apparent that the following exp (exponential) term is dominant in the equation (1) above.

$$\exp\left(-\frac{4\sqrt{2m^*}\,(q\phi_b)^{\frac{3}{2}}}{3q\hbar E_{ox}}\right)$$

When $\phi_b$ changes from 3.1 eV to 4.4 eV in the exponential term, it follows that an electric field $E_{ox1}$ satisfying $E_{ox1}=(4.4)^{3/2}/(3.1)^{3/2}E_{ox}$ should be used to obtain the same $J_{FN}$. Therefore, $E_{ox1}=1.69\,E_{ox}$.

When a voltage difference between a threshold voltage of the write state and a threshold voltage of the erase state is constant, 1.69 times as large oxide film electric field at the time of data retention is allowable. This means that a film thickness toX of an oxide film can be made thinner 0.59 times, as in the equation $t_{ox1}=t_{ox}/1.69=0.59t_{ox}$.

The extent to which the direct tunneling current varies with changes in the barrier height of a potential is also calculated. It is known that the direct tunneling current is approximated as in the following equation (2).

$$J_{DT}=AE^2_{ox}\left(\frac{\phi_b}{V_{ox}}\right)\left(\frac{2\phi_b}{V_{ox}}-1\right)\exp\left(-\frac{4\sqrt{2m^*}\,(q\phi_b)^{\frac{3}{2}}}{3q\hbar E_{ox}}\left(1-\left(1-\frac{V_{ox}}{\phi_b}\right)^{\frac{3}{2}}\right)\right) \quad (2)$$

$J_{DT}$: direct tunnel current density
$V_{ox}$: potential difference across oxide film
A: constant
$\phi_b$: potential barrier height
$E_{ox}$: $SiO_2$ electric field strength
m*: effective mass
q: amount of electron charges $$\hbar=\frac{h}{2\pi}$$

Referring to the equation (2) above, the direct tunneling is caused only when $V_{ox}<\phi_b$. If $V_{ox}<\phi_b$, the exponential term dominating the equation (2) is the same as the exponential term of the FN tunnel. Therefore, it is apparent that the direct tunneling current has a similar tendency as the FN tunnel. It is disclosed, for example, in K. F. Schuegraf et. al., Electron Devices, vol. 41, no5, 1994 (reference 3).

When the FN tunnel current and the direct tunnel current are considered representative tunnel phenomena as described above, it is expected that increase in the barrier height of a potential from 3.1 eV to 4.4 eV substantially reduces the leak current and that a film thickness of an insulating film can thus be made as thin as 0.59 times the current film thickness.

Here, actual leak current might not be related to the mechanisms of the FN tunnel current or the direct tunnel current. It is however easily supposed that the leak current of all mechanisms generally caused by the tunnel phenomena is substantially reduced by increasing barrier height of a potential. Specifically, the leak current of all mechanisms due to the tunnel phenomena can basically be calculated by the WKB (Wentzel-Kramers-Brillouin) approximation. In short, the tunnelling probability P of electrons transmitting through the potential barrier in an x direction of $x_1\rightarrow x_2$ is represented by the following equation (3).

$$P\cong\exp\left[-2\int_{x_1}^{x_2}k(x)dx\right] \quad (3)$$

k(x): attenuation constant of electrons in potential barrier
In a basic equation of (3) above, defining a type of the potential barrier and solving it respectively result in the FN tunnel equation (1) and the direct tunnel equation (2). Thus, the leak current of all mechanisms due to the tunnel phenomena can be reduced by increasing the potential barrier height. As a result, the data retention characteristics of the nonvolatile semiconductor memory device can be improved.

From the reason above, by using P type polysilicon, instead of conventional N type polysilicon, as floating gate electrode 5, the leak current of an insulating film, which is caused by the mechanism due to the tunnel phenomenon can be reduced. As a result, the data retention characteristics can be substantially improved.

Here, the mechanism of the stress induced leak current which is considered to determine a limit of thinness of a tunnel oxide film has not completely revealed. According to recent studies, however, the stress induced current can be explained by the tunnel phenomenon through a trap in a oxide film, which is generated by stress. This is disclosed, for example, in K. Sakakibara et. al., Proc. Int. Rel. Phys. Symp., p100, 1996 (reference 4).

It is therefore considered that the stress induced current is also reduced by increasing the potential barrier, which is realized by the use of P type polysilicon as floating gate electrode 5. As described above, the stress induced current becomes conspicuous when a thin oxide film of less than 10 nm is used, and it degrades the data retention characteristics of the memory. Since the stress induced current can be reduced by the structure of this embodiment, a thin film of less than 10 nm can be used as tunnel oxide film 4 in this embodiment. Assuming the same amount of leak current, electric field $E_{ox}$ applied to the insulating film at the time of data retention can be increased because of increase in the potential barrier height against electrons. When the amount of electrons accumulated in floating gate electrode 5 is the same, electric field $E_{ox}$ applied to the insulating film at the time of data retention can be increased by making the insulating film thinner. In this embodiment, tunnel oxide film 4 can thus be made thinner than 10 nm, and thus the operating voltage at the time of writing/erasing can be lowered. As a result, reduction in power consumption and improvement in the performance of the nonvolatile semiconductor memory device can be achieved.

(Second Embodiment)

Figure 5:
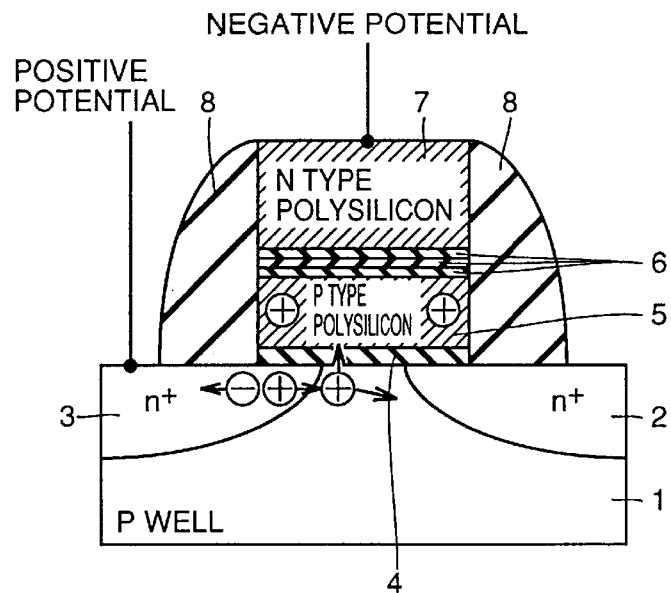
FIG. 5 is a sectional view illustrating a writing of erasing operation of a floating gate type nonvolatile semiconductor memory in accordance with a second embodiment of the present invention.

Referring to FIG. 5, in a nonvolatile semiconductor memory device in accordance with a second embodiment, the writing or erasing operation is performed by band-to-band tunnel current induced hot hole injection in an NMOS type memory cell.

Hot hole injection is generally considered to cause deterioration of tunnel oxide film 4. According to Reference 4 above, the stress induced current is increased with increase in the total amount of charges of holes injected into tunnel oxide film 4. In short, the stress induced current is closely correlated with the amount of injected holes. Therefore, the hot hole injection which increases the stress induced leak current might deteriorate the data retention characteristics of a floating gate type nonvolatile semiconductor memory. Accordingly, the hot hole injection has not been used for the writing/erasing operation.

However, when P type polysilicon is used for floating gate electrode 5 as in the present invention, the data retention characteristics of the nonvolatile semiconductor memory device can substantially be improved because the stress induced leak current can theoretically be reduced. Therefore, the hot hole injection can be used for the writing/erasing operation. In the second embodiment, as one method of the writing or erasing operation in the NMOS type memory cell, holes are injected from the main surface of silicon to floating gate electrode 5 by band-to-band tunnel current induced hot hole implantation.

Specifically, a negative or ground potential and a positive potential are respectively applied to control gate electrode 7 and source diffusion layer 3 or drain diffusion layer 2 in the NMOS type memory cell, as shown in FIG. 5. Thus, an electron-hole pair is generated in source diffusion layer 3 or drain diffusion layer 2 by the band-to-band tunnel phenomenon. A hole of the electron-hole pair is accelerated in the direction of the channel by a lateral electric field, obtains high energy and becomes a hot hole. By injecting this hot hole into floating gate electrode 5 via tunnel oxide film 4, the writting or erasing operation is performed.

(Third Embodiment)

Figure 6:
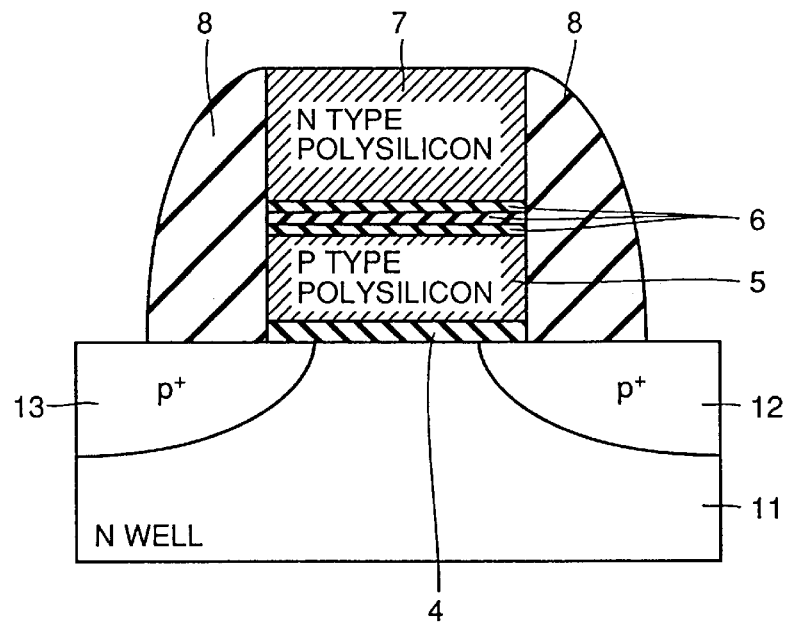
FIG. 6 is a sectional view showing a memory cell of a floating gate type nonvolatile semiconductor memory in accordance with a third embodiment of the present invention.

Referring to FIG. 6, a PMOS type memory cell having a P type source diffusion layer 13 and a P type drain diffusion layer 12 at the surface of an N well 11 is used in a third embodiment, unlike the first and second embodiments. Other structures are the same as the first embodiment shown in FIG. 1. In the PMOS type memory cell as well, the leak current of electrons from floating gate electrode 5 at the time of data retention can effectively be reduced, as in the NMOS type memory cells of the first and second embodiments, by floating gate electrode 5 of P type polysilicon.

In operation, an electric field of at least 10 MV/cm is applied to tunnel oxide film 4, and valence band electrons of floating gate electrode 5 are extracted by the FN tunnel current. The writing or erasing operation is performed in this manner.

Figure 7:
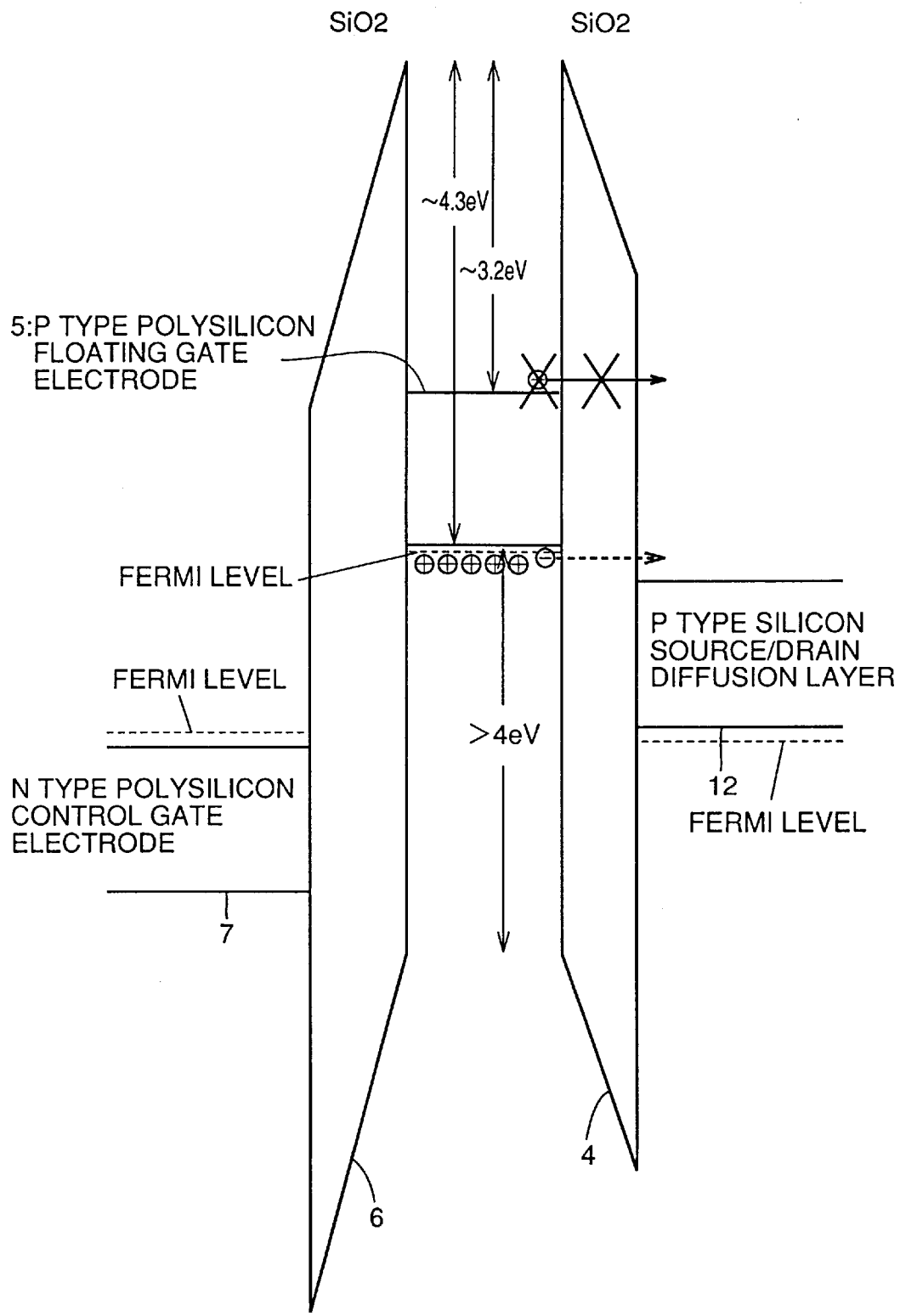
FIG. 7 shows a band for illustrating leak current from the floating gate electrode of the PMOS type memory cell in accordance with the third embodiment shown in FIG. 6.
Figure 8:
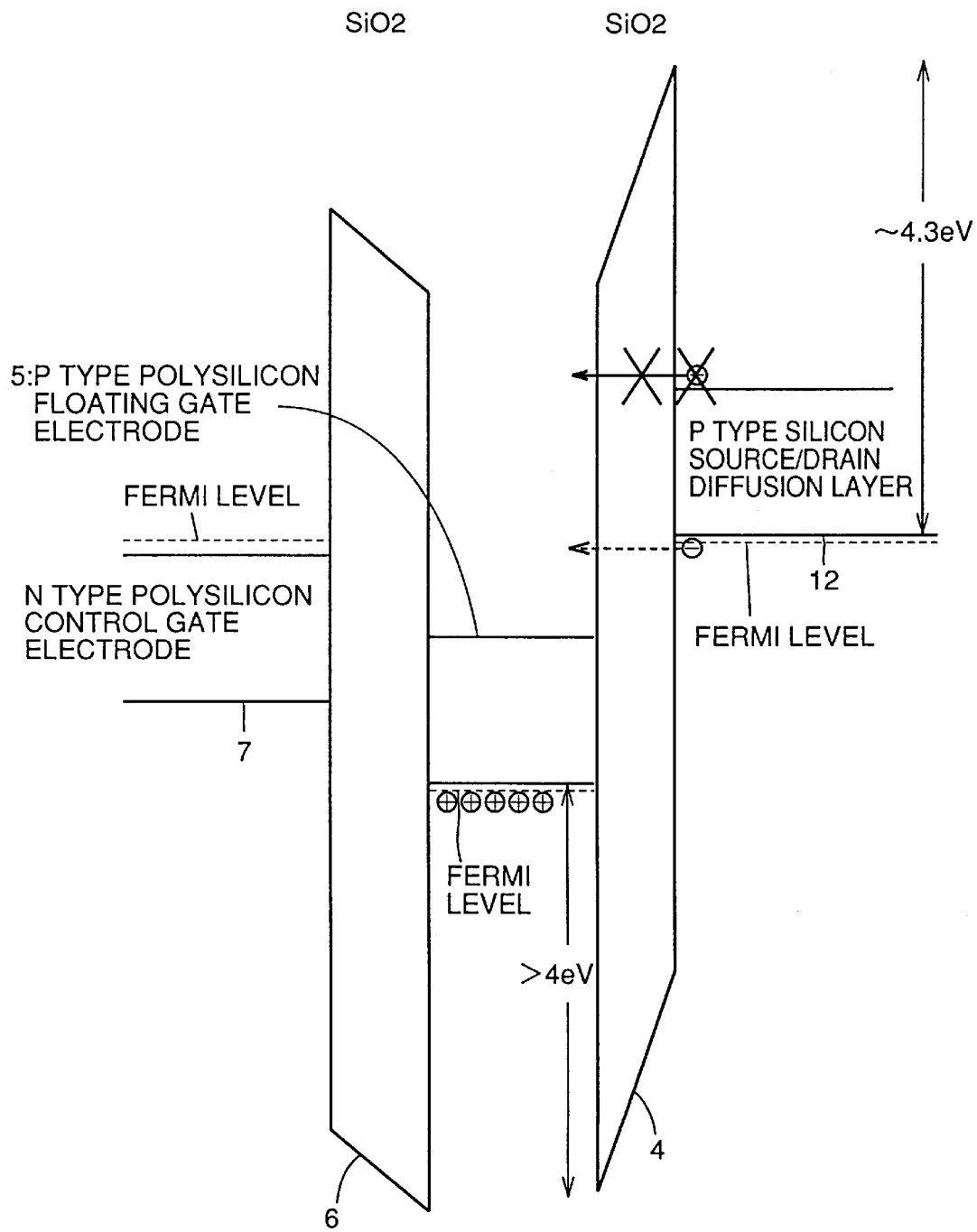
FIG. 8 shows a band for illustrating leak current from source/drain diffusion layers to the floating gate electrode of the PMOS type memory cell in accordance with the third embodiment shown in FIG. 6.

Since source diffusion layer 13 and drain diffusion layer 12 are P type diffusion layers of high concentration in the third embodiment, conduction band electrons do not exist in source diffusion layer 13 and drain diffusion layer 12. Thus, as shown in FIG. 8, current leak from source diffusion layer 13 and drain diffusion layer 12 to floating gate electrode 5 can be reduced as compared with the case of the NMOS type of the first embodiment shown in FIG. 4. In the third embodiment, therefore, the data retention characteristics can be improved as compared with the NMOS type even if the operation conditions are set so that an electric field applied to tunnel oxide film 4 at the time of data retention is in a direction in which electrons are leaked from source diffusion layer 13 and drain diffusion layer 12 to floating gate electrode 5. Here, the electric field in the direction in which electrons are leaked from source diffusion layer 13 and drain diffusion layer 12 to floating gate electrode 5 is caused when floating gate electrode 5 is relatively at a positive potential with respect to source diffusion layer 13 and drain diffusion layer 12. FIG. 7 shows a band for illustrating leak current of electrons from floating gate electrode 5.

(Fourth Embodiment)

Figure 9:
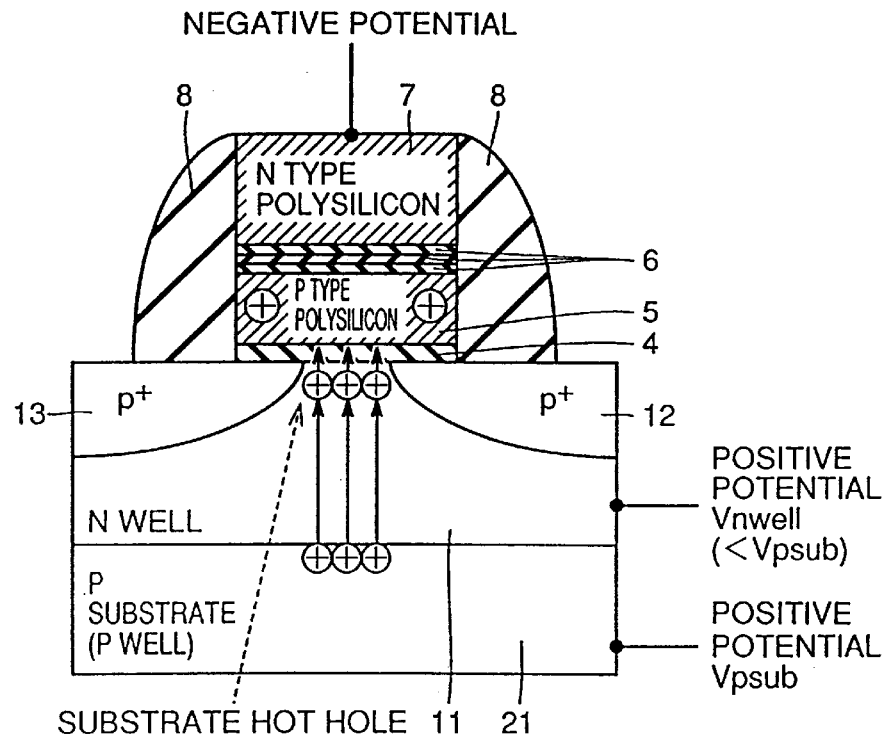
FIG. 9 is a sectional view for illustrating a writing or erasing operation of a floating gate type nonvolatile semiconductor memory in accordance with a fourth embodiment of the present invention.

In a fourth embodiment, the writing or erasing operation is performed by injecting hot holes into a substrate in the PMOS type memory cell, as shown in FIG. 9. Although the hot hole injection which increases the stress induced leak current has not conventionally used as described above, the hot hole injection can be used for the writing/erasing operation by using P type polysilicon as floating gate electrode 5.

In the fourth embodiment, a negative potential, a positive potential (Vnwell), and a positive potential (Vpsub) are respectively applied to control gate electrode 7, N well 11, and a P substrate (or P well) 21 in the PMOS type memory cell, as shown in FIG. 9. Here, Vnwell<Vpsub. By thus applying voltages, holes are injected from p substrate 21 to N well 11. The injected holes are accelerated in the direction of the channel by a longitudinal electric field, and they obtain high energy and become hot holes. The writing or erasing operation is performed by injecting the hot holes into floating gate electrode 5 through tunnel oxide film 4.

Figure 10:
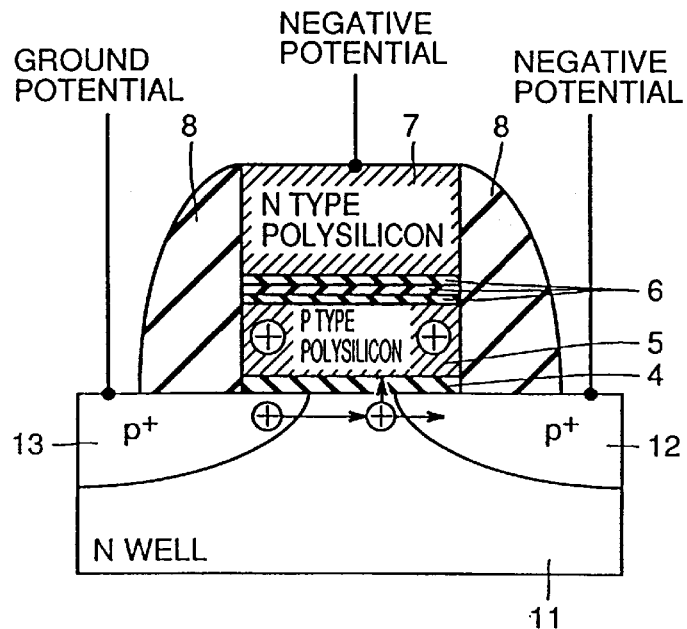
FIG. 10 is a sectional view for illustrating a writing or erasing operation by a modification of the fourth embodiment of the present invention.

As a modification of the fourth embodiment, a method of injecting holes as shown in FIG. 10 may also be used. Referring to FIG. 10, in this modification, a negative potential is applied to P type drain diffusion layer 12 and control gate electrode 7, and a ground potential is applied to P type source diffusion layer 13. Thus, a channel inversion layer is formed at the channel region, and channel current is caused to flow between source/drain regions. Of the channel current caused by holes, part of the holes becomes hot holes by acceleration due to the lateral electric field. By injecting the hot holes into floating gate electrode 5 through tunnel oxide film 4, the writing or erasing operation is performed. Such injection is called channel current induced hot hole injection.

(Fifth Embodiment)

Figure 11:
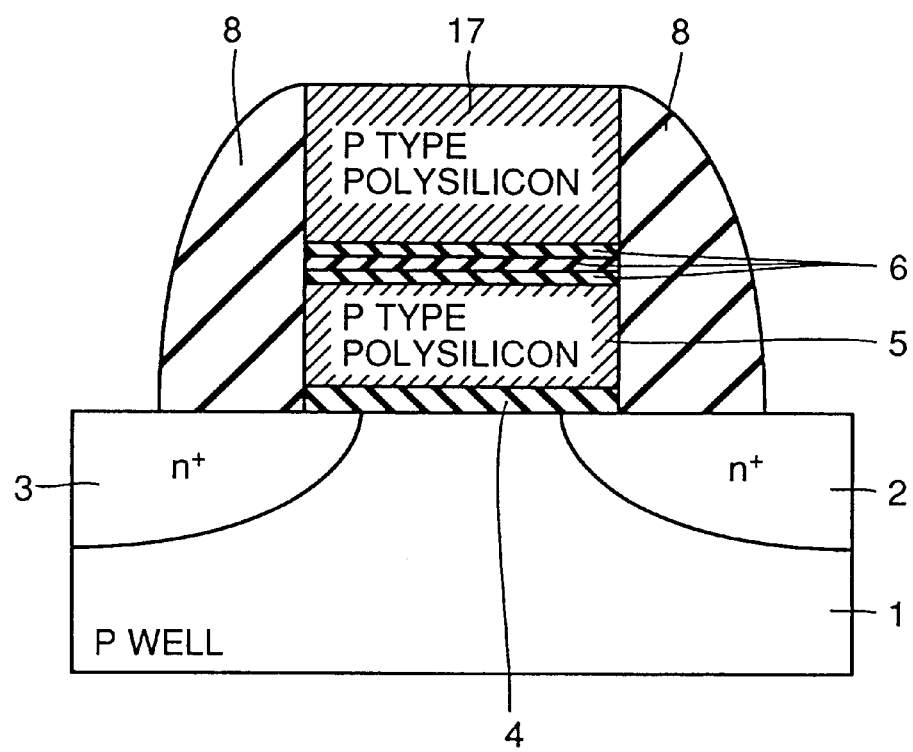
FIG. 11 is a sectional view showing a memory cell of a floating gate type nonvolatile semiconductor memory in accordance with a fifth embodiment of the present invention.
Figure 12:
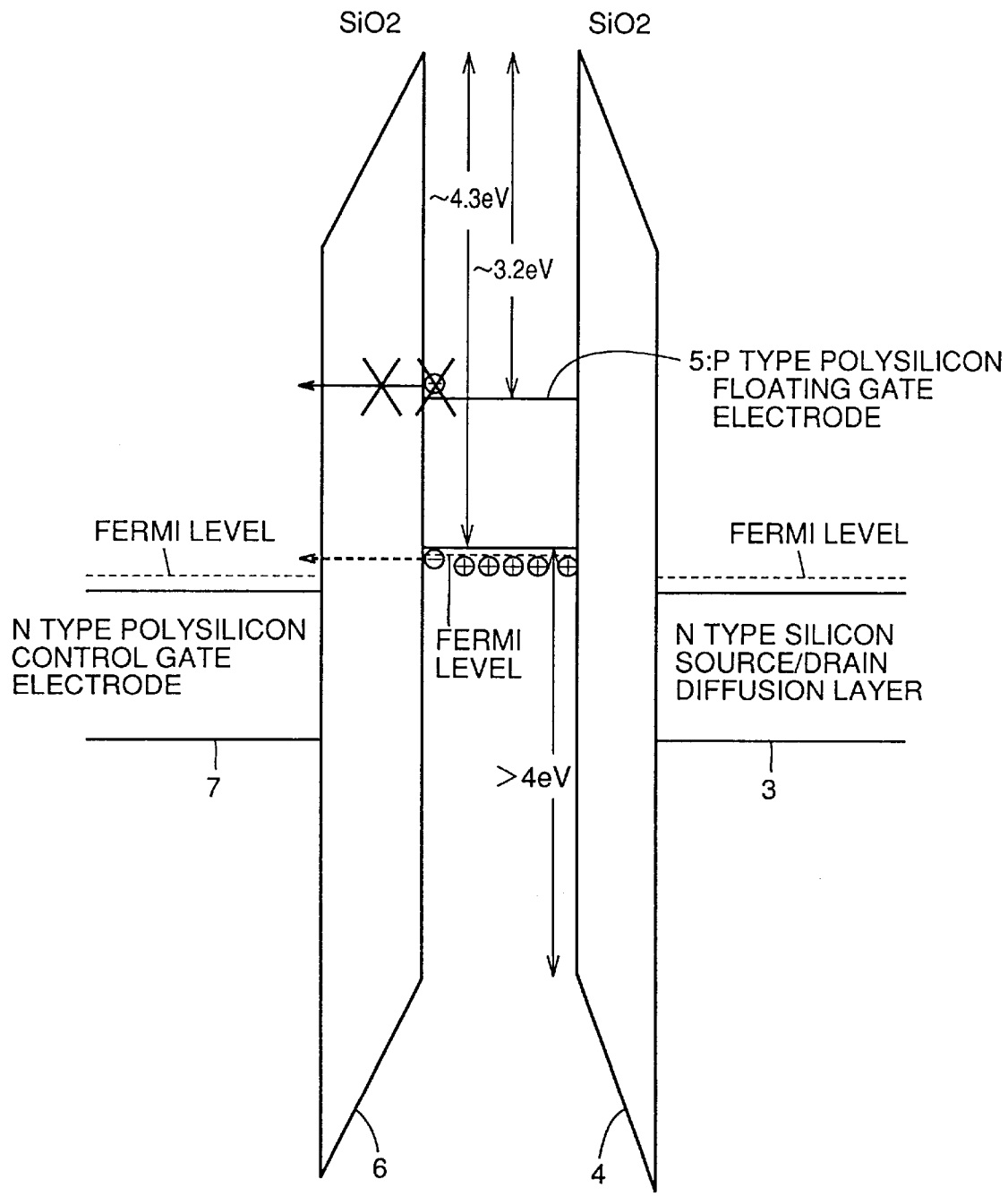
FIG. 12 shows a band for illustrating leak current from the floating gate electrode to the control gate electrode when the floating gate electrode of P type polysilicon and the control gate electrode of N type polysilicon are used.
Figure 14:
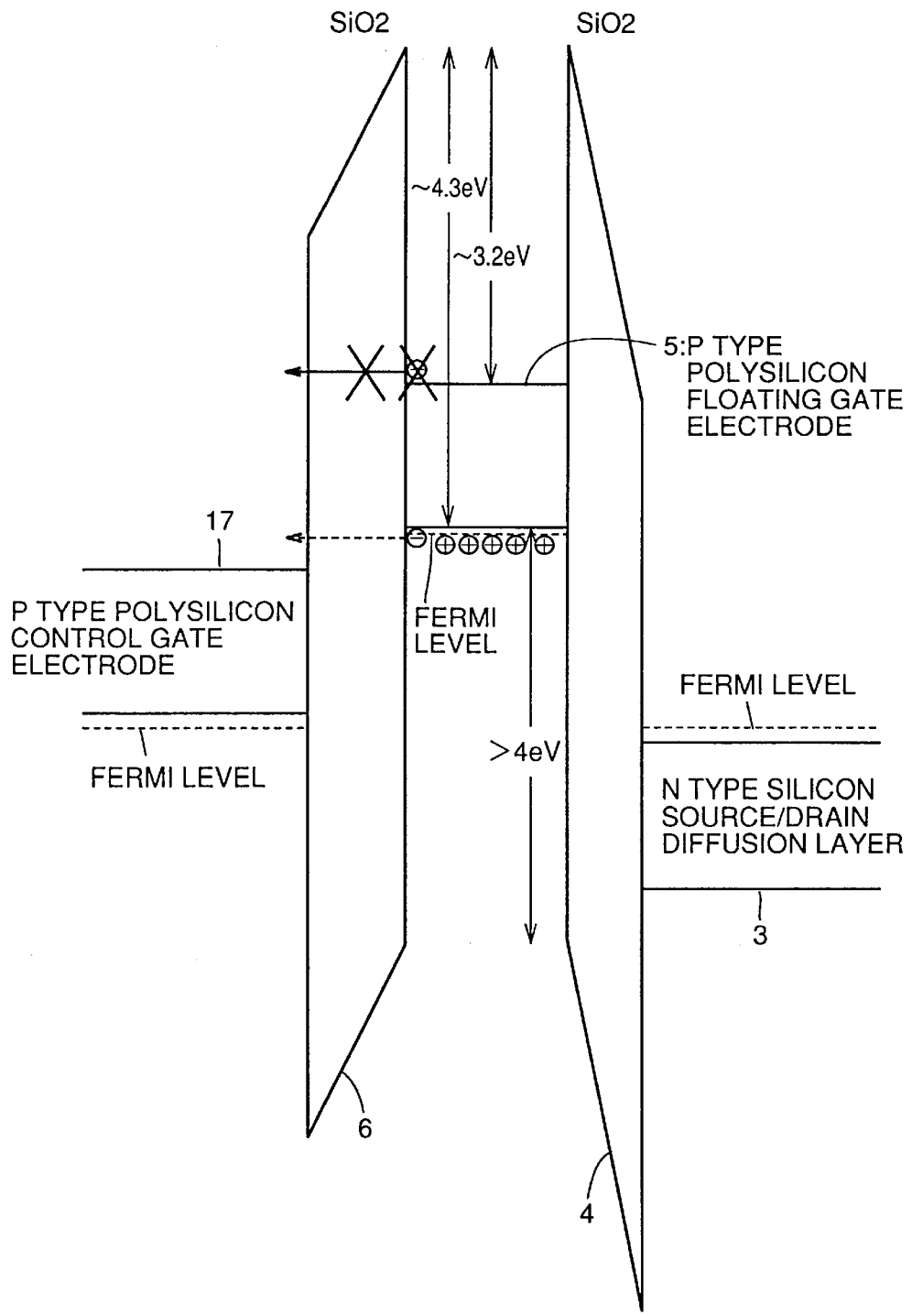
FIG. 14 shows a band for illustrating leak current from the floating gate electrode to the control gate electrode when the floating gate electrode of P type polysilicon and the control gate electrode of P type polysilicon are used.

Referring to FIG. 11, in a fifth embodiment, not only floating gate electrode 5 but control gate electrode 17 is formed of P type polysilicon in the NMOS type memory cell. Thus, the leak current from floating gate electrode 5 to control gate electrode 7 or 17 can be reduced, as shown in FIGS. 12 and 14, by floating gate electrode 5 of P type polysilicon. Furthermore, in another embodiment of the present invention, the source region 2 and drain region 3 may be P type rather than N type.

Figure 13:
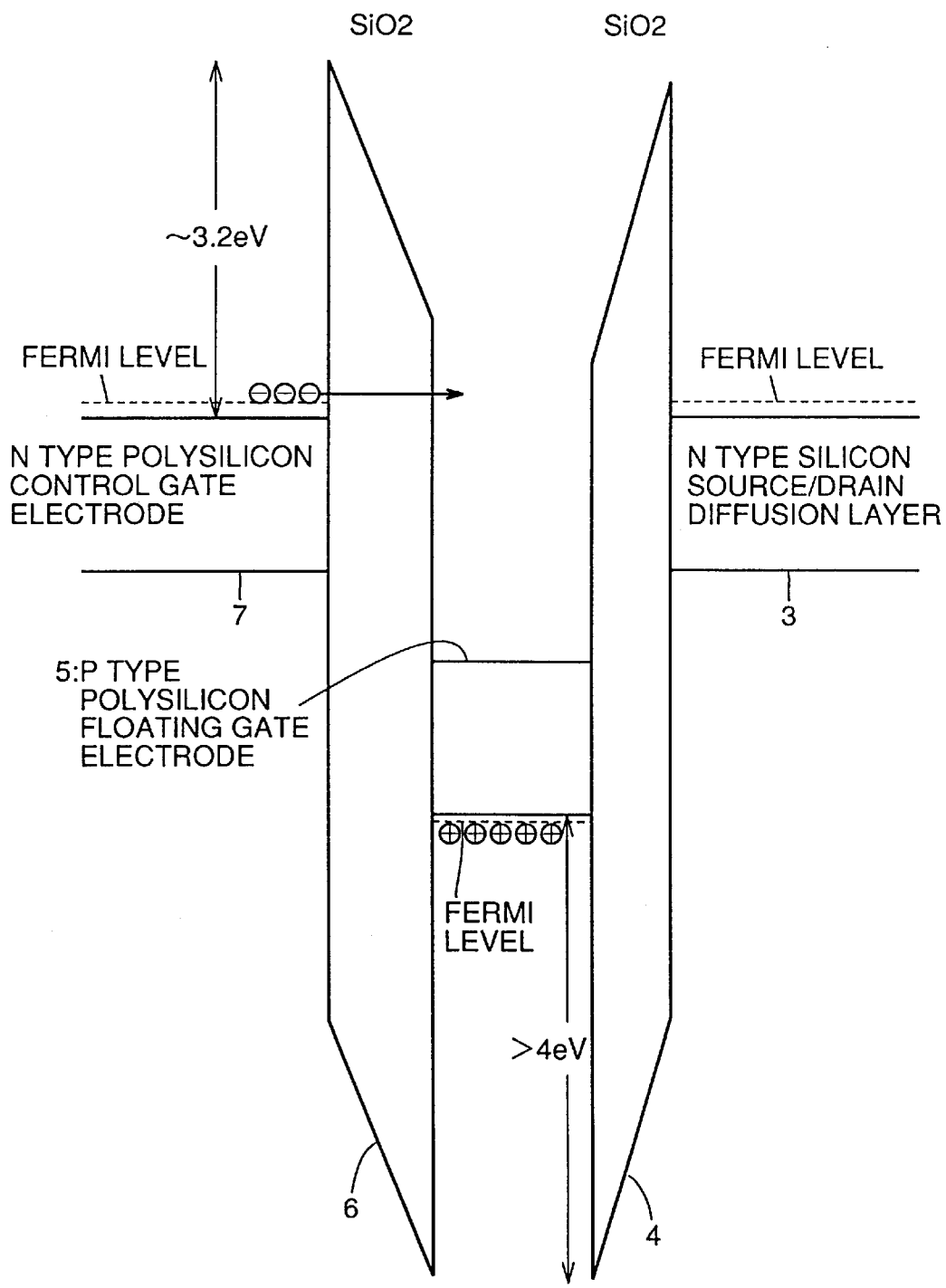
FIG. 13 shows a band for illustrating leak current from the control gate electrode to the floating gate electrode when the floating gate electrode of P type polysilicon and the control gate electrode of N type polysilicon are used.
Figure 15:
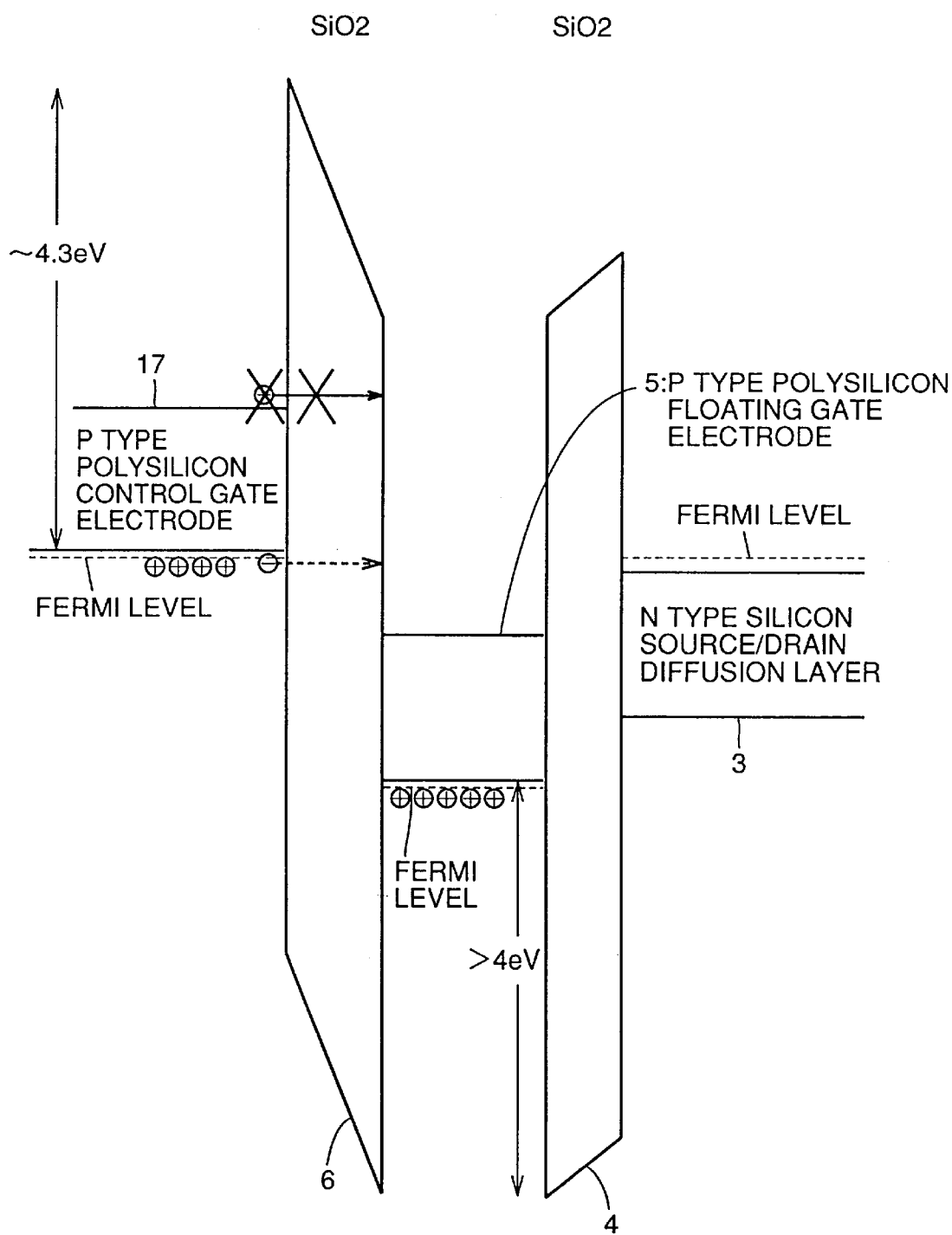
FIG. 15 shows a band for illustrating leak current from the control gate electrode to the floating gate electrode when the floating gate electrode of P type polysilicon and the control gate electrode of P type polysilicon are used.

Further, by forming control gate electrode 17 of P type polysilicon, the potential barrier against electrons, of control gate electrode 17 and that of insulating film (SiO$_2$ in this case) 6 are increased. Thus, the leak current of electrons from control gate electrode 17 to floating gate electrode 5 is reduced as shown in FIG. 15. The leak current from control gate electrode 17 shown in FIG. 15 is reduced more than the case in which control gate electrode of N type polysilicon shown in FIG. 13 is used.

Since the leak current from control gate electrode 17 can thus be reduced, interlayer insulating film 6 can be made thinner. Thinner interlayer insulating film 6 increases the coupling ratio. Thus, voltage applied to control gate electrode 17 can effectively be transmitted to floating gate electrode 5. As a result, lower operating voltage and power consumption can be achieved.

In the energy bands shown in FIGS. 12 to 15, interlayer insulating film 6 is not an ONO film but an SiO$_2$ film, for simplicity.

Since the data retention characteristics can thus be improved by using P type polysilicon as control gate electrode 17, following effects can be obtained. That is, even if device conditions are set so that the electric field applied to interlayer insulating film 6 at the time of data retention is in a direction in which electrons are leaked from control gate electrode 17 to floating gate electrode 5, the leak current can effectively be reduced through interlayer insulating film 6, and thus the data retention characteristics can be improved. The same effects can be obtained even if the structure of forming control gate electrode 17 and floating gate electrode 5 shown in FIG. 11 of P type polysilicon is applied to the PMOS type memory cell shown in FIGS. 6, 9 and 10.

(Sixth Embodiment)

In a sixth embodiment, the writing or erasing operation is performed by using the FN tunnel phenomenon for electrons which are generated due to the band-to-band tunnel current phenomenon in a depletion layer within floating gate electrode 5 of P type polysilicon. When P type polysilicon is used as floating gate electrode 5, the conduction band of P type polysilicon does not have electrons. In the first embodiment, therefore, the writing or erasing operation is performed by using the FN tunnel phenomenon of electrons from the valence band, as shown in FIG. 2. In the sixth embodiment, concentration of a P type impurity in P type polysilicon constituting floating gate electrode 5 is made a little lower in the entire floating gate electrode 5 or in the vicinity of an interface between floating gate electrode 5 and tunnel oxide film 4. Thus, when electrons are pulled out by applying an electric field of not less than 10 MV/cm to tunnel oxide film 4, a depletion layer is formed in the vicinity of the interface between floating gate electrode 5 and tunnel oxide film 4.

Figure 16:
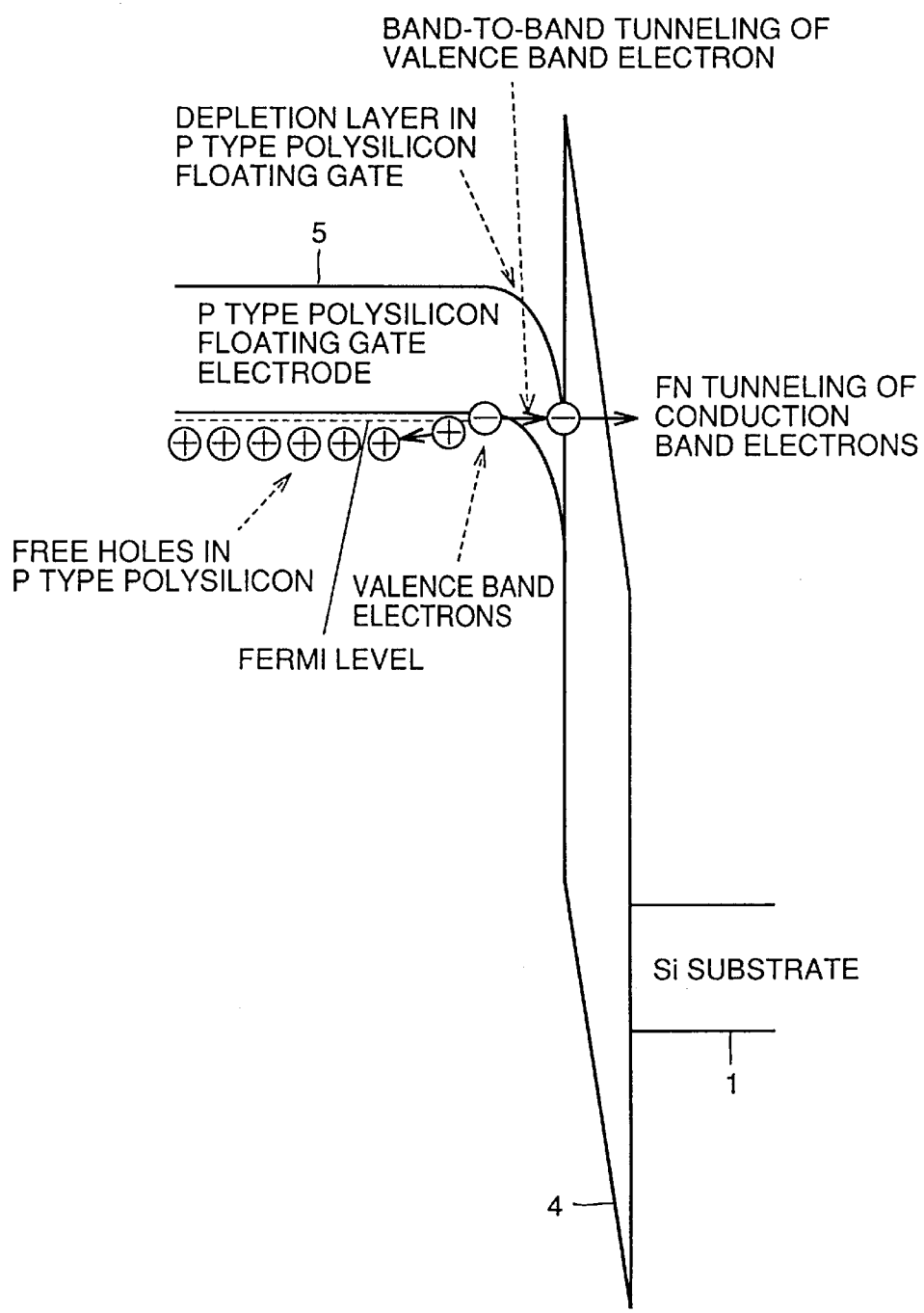
FIG. 16 shows a band for illustrating a writing or erasing operation in accordance with a sixth embodiment of the present invention.

As shown in FIG. 16, a band potential of the depletion layer is bent 1.1 V to 1.5 V as a whole. Since the band of this depletion layer is bent due to a band gap of silicon in this case, the band-to-band tunnel phenomenon of electrons from the valence band to the conduction band is caused. Conduction band electrons in floating gate electrode 5, generated by the band-to-band tunnel phenomenon, are transmitted to the Si substrate 1 because of the FN tunnel phenomenon.

Since such a depletion phenomenon prevents the effective use of applied voltage, attention has basically be paid so as not to cause depletion. In the sixth embodiment, however, depletion is intentionally caused to a small extent. Thus, by utilizing generation of conduction band electrons due to the band-to-band tunnel which is caused by the depletion phenomenon, the efficiency of generating the FN tunnel phenomenon can be improved. Although the potential barrier of the oxide film against valence band electrons is 4.4 eV as described above, the potential barrier against conduction band electrons is as small as 3.2 eV.

Since the FN tunnel phenomenon of conduction band electrons is used in the sixth embodiment, the efficiency of generating the FN tunnel phenomenon can substantially be improved. However, since only a small electric field is applied to tunnel oxide film 4 at the time of data retention, voltage of not more than 1.1 V is not applied to the depletion layer in floating gate electrode 5. Therefore, the band-to-band tunnel phenomenon is not caused at all, and thus the data retention characteristics can not be degraded.

The embodiments disclosed herein are purely illustrative and not intended to be in any sense limiting. The scope of the present invention is limited not by the above described embodiments but by the appended claims, and it includes all modifications within the spirit and scope of the appended claims. For example, the embodiments describe the case in which a floating gate type nonvolatile semiconductor memory is formed at a silicon substrate, but it is also applicable to a floating gate type nonvolatile semiconductor memory utilizing a thin film semiconductor layer of the SOI structure.

What is claimed is:

1. A nonvolatile semiconductor memory device, comprising:
    a P type source region and a P type drain region formed spaced apart with a channel region therebetween, at a main surface of an N type semiconductor region;
    a first insulating film formed on said channel region and having a thickness of less than 10 nm;
    a floating gate electrode formed on said first insulating film and containing P type polycrystalline silicon;
    a second insulating film formed on said floating gate electrode; and
    a control gate electrode formed on said second insulating film, wherein an electric field of at least 10 MV/cm is applied to said first insulating film, and electrons in said floating gate electrode are extracted toward the main surface of said semiconductor region by tunnel phenomenon, whereby a writing or erasing operation is performed by increasing the amount of positive charges in said floating gate electrode.

2. The nonvolatile semiconductor memory device according to claim 1, wherein
    said control gate electrode contains P type polycrystalline silicon.

3. A nonvolatile semiconductor memory device, comprising:
    a P type source region and a P type drain region formed spaced apart with a channel region therebetween, at a main surface of an N type semiconductor region;
    a first insulating film formed on said channel region and having a thickness of less than 10 nm;
    a floating gate electrode formed on said first insulating film and containing P type polycrystalline silicon;
    a second insulating film formed on said floating gate electrode; and
    a control gate electrode formed on said second insulating film, wherein
    a writing or erasing operation is performed by increasing the amount of positive charges in said floating gate electrode by hot hole injection phenomenon from the main surface of said semiconductor region to said floating gate electrode.

4. The nonvolatile semiconductor memory device according to claim 3, wherein
    said control gate electrode contains P type polycrystalline silicon.

* * * * *